(12) United States Patent
Stoddard et al.

(10) Patent No.: US 11,450,368 B1
(45) Date of Patent: Sep. 20, 2022

(54) SYSTEMS AND METHODS FOR ADAPTIVE WRITE TRAINING OF THREE DIMENSIONAL MEMORY

(71) Applicant: Micron Technology, Inc., Boise, ID (US)

(72) Inventors: Christopher Heaton Stoddard, Caldwell, ID (US); Yang Lu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/200,293

(22) Filed: Mar. 12, 2021

(51) Int. Cl.
| | |
|---|---|
| *G11C 7/00* | (2006.01) |
| *G11C 8/18* | (2006.01) |
| *G11C 7/22* | (2006.01) |
| *G11C 8/10* | (2006.01) |

(52) U.S. Cl.
CPC ............... *G11C 8/18* (2013.01); *G11C 7/222* (2013.01); *G11C 8/10* (2013.01)

(58) Field of Classification Search
CPC ...................................................... G11C 8/18
USPC ............................................................ 365/193
See application file for complete search history.

(56) References Cited

U.S. PATENT DOCUMENTS

2019/0004984 A1\* 1/2019 Lee ..................... G06K 9/6255
2019/0228808 A1\* 7/2019 Penney ............... G11C 11/4076

\* cited by examiner

*Primary Examiner* — Hoai V Ho
(74) *Attorney, Agent, or Firm* — Fletcher Yoder, P.C.

(57) ABSTRACT

A memory system is provided. The memory system includes a memory controller and a data bus electrically coupled to the memory controller. The memory system further includes one or more memory devices communicatively coupled to the memory controller via the data bus, wherein each of the one or more memory devices comprises a write training setting configured to adjust a write timing of data being sent by the memory controller to the one or more memory devices during write operations of the memory system.

20 Claims, 4 Drawing Sheets

SYSTEMS AND METHODS FOR ADAPTIVE WRITE TRAINING OF THREE DIMENSIONAL MEMORY

BACKGROUND

Field of the Present Disclosure

The present disclosure relates to three dimensional memory, and more specifically, to systems and methods for applying adaptive write training to the three dimensional memory.

Description of Related Art

Certain read/write memory devices, such as three dimensional memory crosspoint memory (3DXP), include stacked (e.g., multi-dimensional) arrays having memory areas that store information. For example, certain 3DXP devices may have one or more layers of memory having many addressable memory elements or cells included in memory arrays. In use, the 3DXP devices may receive data input signals and store data in the memory cells based on the data input signals. The memory cells may then be accessible to external systems and may be used to store the data stored therein, for example, via certain write signals. It would be beneficial to improve the writing of certain data from the memory cells.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

Figure 1:
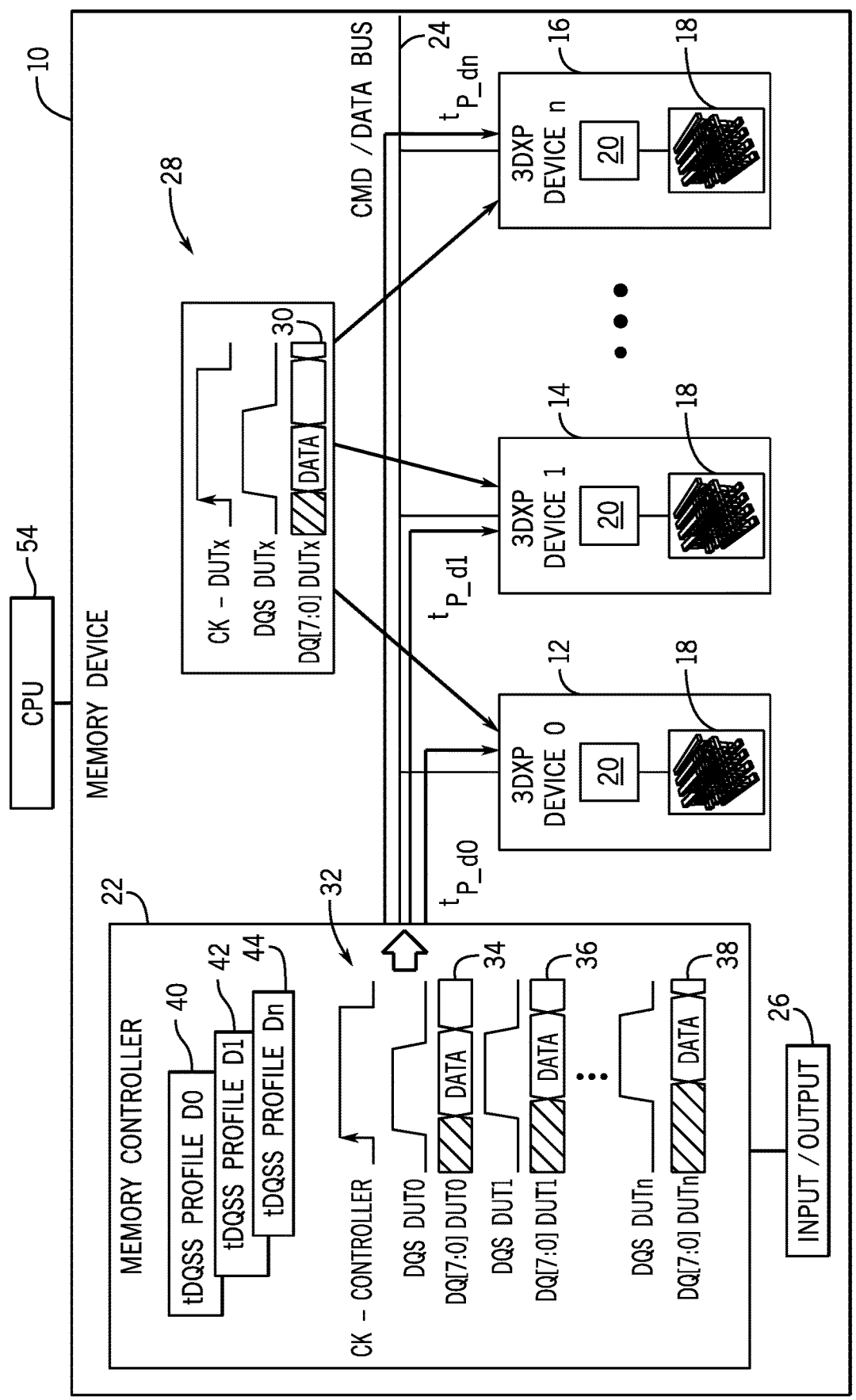
FIG. 1 is a block diagram illustrating an organization of a memory system that may include a plurality of three dimensional crosspoint memory (3DXP) devices, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include devices coupled to processing circuit, and memory devices may provide storage for data processing. Examples of memory devices include random access memory (RAM), flash memory (e.g., Not-AND (NAND) memory), dynamic RAM (DRAM) devices and synchronous DRAM (SDRAM) devices, which may store individual bits electronically. Additional memory devices may include multi-dimensional memory devices, such as three dimensional crosspoint memory (3DXP), which may also store individual bits. The stored bits may be organized into addressable memory elements (e.g., words), which may be stored in memory areas, such as banks or partitions. To transmit and to receive the bits, the memory devices may include certain data communication circuitry as well as communication lines coupled to a memory controller, for example.

A 3DXP component (e.g., device or die) may have been "trimmed" during manufacturing to provide for similar write interface timing performance as other 3DXP components in the same package (e.g., semiconductor chip), for example. However, during use, the memory controller may perform a write training to improve interfacing with the 3DXP components. During the write training, a controller may adjust an internal timing delay setting stored in the controller that may set where a data strobe (e.g., DQS) toggles (e.g., going logical high and/or logical low) during a write operation, for example, to match a clock signal (CLK). After the training is performed, a training profile for each 3DXP component may then be generated and stored in the controller's memory and/or cache space. The more 3DXP components in the system, the more memory and/or cache space may be needed to store each 3DXP component's training profile.

When accessing different 3DXP components that share, for example, the same communications channel, the controller may also need extra time to load and switch to the targeted 3DXP component's write training profile. Accordingly, a profile switching may occur, and frequent profile switching may lead to a lower write efficiency of the memory device. An adaptive training technique is described herein, suitable for storing write training setting(s) in the 3DXP component itself as opposed to in the controller. That is, the 3DXP components themselves may now store certain timing settings, receive timing settings, and/or adaptively adjust timing when communicating with the controller, as further described below. It is to be noted that other memory components may benefit from the techniques described herein additional to or alternative to 3DXP, such as DRAM, flash memory (e.g., NAND memory), and the like.

Turning now to the figures, FIG. 1 is a simplified block diagram illustrating certain features of an embodiment of a memory system 10. The memory system 10 may be a dual in-line memory device (DIMM), a solid state drive, a universal serial bus (USB) drive, a memory card, or other mass storage system or device. The block diagram of FIG. 1 is a functional block diagram illustrating certain functionality of the memory system 10 having multiple memory devices. In accordance with one embodiment, the memory system 10 may utilize one or more crosspoint memory (3DXP) devices suitable for storing and retrieving data for external systems, such as for microprocessors. Various features of the memory system 10, as further described herein, allow for improved power consumption, higher efficiency, and more adaptable functionality.

The memory system 10, may include a number of 3DXP devices, such as the illustrated 3DXP devices 12, 14, and 16. Each of the 3DXP devices 12, 14, and 16 may be a non-volatile memory (NVM) device having one or more multi-dimensional arrays 18, such as 3DXP arrays. The multi-dimensional array(s) 18 may each include multiple array cells, each cell storing, for example, one bit, and a selector which may enable a memory cell to be written and read without the use of a transistor. Bit lines (BLs) and word lines (WLs) may be disposed in the multi-dimensional array 18 perpendicular to each other to connect submicroscopic columns of cells. Accordingly, BLs and WLs with additional use of the selector may select cell(s) for reading and/or for writing of data. The multi-dimensional array 18 may use phase change material (e.g., chalcogenide) with different resistances for storing data, so that, for example, an amorphous state may store a logic 0 and a crystalline state may store a logic 1.

An adaptive delay write circuit 20 is also shown. The adaptive delay write circuit 20 may receive as input a reference clock (e.g., internal clock) and then derive a delay (e.g., timing offset) for each device 12, 14, 16. The derived delay value may then be added to a clock (CLK) and/or to a data strobe (e.g., DQS) write path during write operations, for example, as a timing signal for determining a write timing of data of the multi-dimensional array 18. By adding a custom write delay or timing offset, the techniques described herein may provide for more efficient and less storage intensive writes of the memory system 10.

As illustrated, the 3DXP devices 12, 14, and 16 are disposed at varying physical distances from a memory controller 22. More specifically, each of the 3DXP devices 12, 14, and 16 is disposed to communicate with the memory controller 22 via a command/data bus 24 at different physical locations along the bus 24. For example, the 3DXP device 12 is shown as closest physically from the memory controller 22 while the 3DXP device 16 is shown as furthest away from the memory controller 22. Accordingly, signals from the memory controller 22 may be received more quickly by the 3DXP device 12 when compared to the 3DXP device 16 because of propagation time delays. In certain embodiments, the 3DXP devices 12, 14, and 16 may be "trimmed" or otherwise sized to attempt to achieve similar write timing performance. However, the memory controller 22 may still experience certain differences in communication from the 3DXP devices 12, 14, and 16 due to positional differences of the devices in the memory system 10.

In certain embodiments, a tDQSS may refer to a position of the data strobe (DQS) (e.g., for data strobe for data pins 26) relative to an internal clock (CLK). The 3DXP devices 12, 14, and 16 may be trimmed to arrive at a similar write timing (e.g., similar tDQSS) to ameliorate differences in location of each device. Graph 28 illustrates a write timing for data 30 to be received from the input/output pins 26 based on trimming the 3DXP devices 12, 14, and 16.

However, each of the 3DXP devices 12, 14, and 16 may have different transmission line propagation times (e.g., $t_{P\_d0}$, $t_{P\_d1}$, and $t_{P\_dn}$ respectively) based on differing transmission distances. For example, the data at the memory controller 22 may be delayed due to transmission distances. Graph 32 illustrates time staggered data 34, 36, 38 being sent by the memory controller 22 because of differing transmission line propagation times. For example, data 34 may correspond to data transmitted to the 3DXP device 12 (shown arriving first), followed by data 36 which may correspond to data transmitted to the 3DXP device 14, and lastly followed by data 38 which may correspond to data transmitted to the 3DXP device 16.

In some embodiments, the memory controller 22 may derive one or more write profiles 40, 42, 44 for example, to account for time propagation delays and/or "trimming" issues. For example, during a write training such as when the memory system 10 is first in use, or when a user requests it, the memory controller 22 may receive the data 34, 36, 38 and adjust a register or latch setting (e.g., plus or minus time adjustment setting) to account for differing tDQSS for each device 12, 14, 16, thus providing an improved writes of the data 34, 36, 38. The register or latch setting(s) may then be stored in the write profiles 40, 42, 44. The write profiles 40, 42, 44 may then enable the memory controller 22 to transmit the data 34, 36, and/or 38 at improved and more accurate timing locations.

In the embodiment shown in FIG. 1, as more 3DXP devices are placed on the bus 24, more write profiles may be created. However, an increased number of write profiles may result in an increased time to search for and to load the correct write profile (e.g., an increase in switch write profile time), as well as increased storage space for the write profiles. Accordingly, the techniques described herein may include the use of adaptive systems disposed in each of the 3DXP devices 12, 14, 16, as described in more detail with respect to FIG. 2, which may minimize or eliminate tDQSS profile switching.

Figure 2:
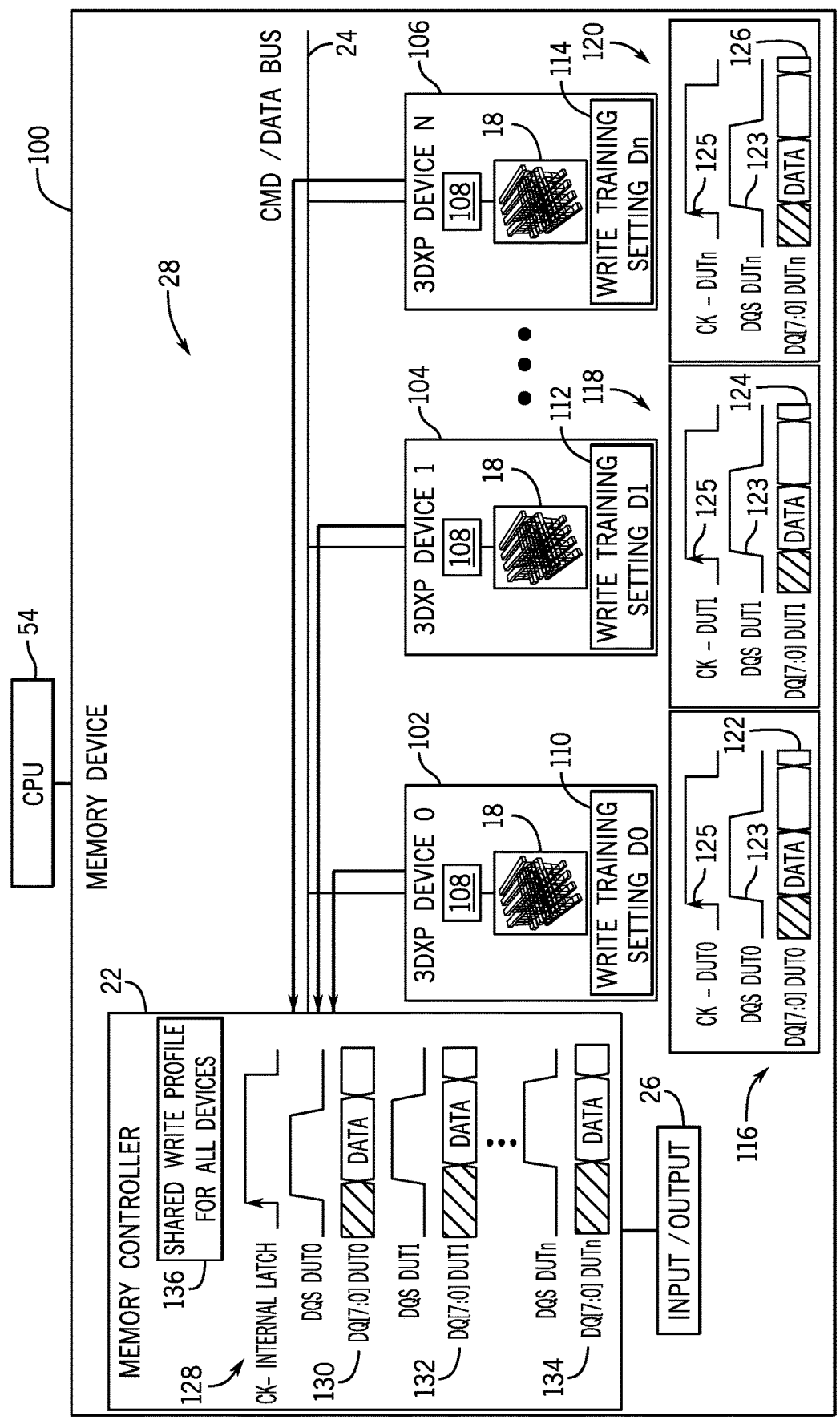
FIG. 2 is a block diagram illustrating an organization of a memory system that may include a plurality of three dimensional crosspoint memory (3DXP) devices each having adaptive write timing circuits, in accordance with an embodiment.

FIG. 2 is a simplified block diagram illustrating certain features of an embodiment of the memory system 100 having adaptive write timing techniques disposed in each 3DXP device. More specifically, the block diagram of FIG. 2 is a functional block diagram illustrating certain functionality included in one or more three dimensional crosspoint memory (3DXP) devices suitable for write timing adaptation. Because the figure includes similar elements as those found in FIG. 1 and described above, the similar elements are numbered using the same element numbers. In the depicted embodiment, the memory system 100 may include a plurality of 3DXP devices, such as the illustrated 3DXP devices 102, 104, and 106. Each of the 3DXP devices 102, 104, and 106 may be a non-volatile memory (NVM) device having one or more multi-dimensional arrays 18, such as 3DXP arrays. As previously described, the multi-dimensional array(s) 18 may each include multiple array cells storing, for example, one bit, and a selector which may enable a memory cell to be written and read without the use of a transistor. Bit lines (BLs) and word lines (WLs) may be disposed in the multi-dimensional array 18 perpendicular to each other to connect submicroscopic columns of cells. Accordingly, BLs and WLs with the selector may select cell(s) for read and/or write of data. The multi-dimensional array 18 may use phase change material (e.g., chalcogenide) with different resistances for storing data, so that, for example, an amorphous state may store a logic 0 and a crystalline state may store a logic 1.

An adaptive write timing circuit 108 is also shown. The adaptive write timing circuit 108 may receive as input a reference clock and then derive a write delay offset, for example, to add the write delay offset to tDQSS (e.g., the position of the data strobe (DQS) (e.g., for data strobe for data pins 26) relative to an internal clock (CLK)). In one embodiment, the memory controller 22 may now set a tDQSS timing based on memory system 100 design so that the tDQSS at the device side (e.g., device 102, 104, 106) is inside of a desired range. In certain embodiments, the memory controller 22 may initiate a normal write training and/or a write leveling training with tDQSS offset command instead of tuning the DQS via individual profiles (e.g., profiles 40, 42, 44) to CLK delay.

Write leveling may refer to the memory controller 22 detecting a flight-time difference of the clock signal (CLK) between the different devices 102, 104, 106, and then delaying the data lanes (bus 24 data lane data transmission) appropriately so that data reaches the devices 102, 104, 106 as the clock and address signals both reach the devices 102, 104, 106. The process of deriving timing delays, which may usually be performed at power up, may be referred to as "training" while the entire process of delaying data transmission to match the clock signal to the address signal at the devices 102, 104, 106 may be referred to as "write leveling." Normal writes may then be referred to data writes where the memory controller 22 is not using write leveling. In certain embodiments, the memory controller 22 may offset tDQSS to derive where the device's CLK and tDQSS are more (or completely) internally aligned, then store the derived tDQSS offset setting on the respective device (e.g., device 102, 104, 106) to result in improved data transmission.

As illustrated, the 3DXP devices 102, 104, and 106 are disposed at varying physical distances from the memory controller 22. More specifically, each of the 3DXP devices 102, 104, and 106 is disposed to communicate with the memory controller 22 via the command/data bus 24 at different locations along the bus 24. For example, the 3DXP system 102 is shown as closest physically from the memory controller 22 while the 3DXP system 106 is shown as further away from the memory controller 22. Accordingly, signals to the 3DXP device 102 may be received more quickly than signals to the 3DXP device 106. In certain embodiments, the 3DXP devices 102, 104, and 106 may be "trimmed" or otherwise sized to attempt to achieve similar write timing performance. However, the memory controller 22 may still experience certain differences in communication from the 3DXP devices 102, 104, and 106 due to the devices' positional differences in the memory system 100.

In the depicted embodiment, a write training (e.g., write leveling training and/or normal write training) may result in write training settings 110, 112, 114 suitable for improving write timings for each of the 3DXP devices 102, 104, 106, respectively. That is, during first use of the memory system 100 (or when requested by a user), for example, each of the 3DXP devices 102, 104, 106 may self-adjust by storing settings 110, 112, 114 to improve write timings when communicatively and/or operatively coupled to the memory controller 22. The settings 110, 112, 114, may include adjust settings, set settings, and/or reset settings, for example for the tDQSS. An adjust tDQSS setting may provide an offset from the tDQSS (e.g., a time t offset from tDQSS), different, for example, from a factory offset. A set tDQSS setting may then tell the memory controller 22 to use the custom tDQSS offset. A reset tDQSS setting may be used to tell the memory controller 22 to reset to the factory tDQSS offset, if any.

The write settings may then be used via the adaptive circuit 108 to provide for improved write timings, as further described below with respect to FIG. 3. Graphs 116, 118, 120 now show data 122, 124, 126 having adjusted timings when transmitted by the memory controller 22 so that the 3DXP devices 102, 104, 106 may align their tDQSS to CLK. More specifically, a DQS start edge 123 may now be within a time range of a CLK start edge 125. For example, the edge 123 may start at approximately the same time as the edge 125 or within a desired time period of the edge 125. Indeed, graph 128 illustrates data 130, 132, 134 received with aligned tDQSS and CLK, thus improving write accuracy and efficiency. When data 130, 132, 134 is sent via the memory controller 22, the data may now show similarly aligned timings at the respective device 102, 104, 106.

The illustrated embodiment of the memory system 100 also shows an optional write profile 136. The write profile 136 may be equivalent to the write profiles 40, 42, 44 described above with respect to FIG. 1. That is, the write profile 136 may be derived to account for time propagation delays and/or "trimming" issues but because of the use of the settings 110, 112, 114 the write profile 136 may now be shared across the 3DXP devices 102, 104, 106 as opposed to having one write profile for each of the 3DXP devices 102, 104, 106. For example, the write profile 136 may offset tDQSS for all 3DXP devices 102, 104, 106 or compensate for common tDQSS difference of each DQ. Accordingly, profile context switching may be eliminated as only one write profile 136 may now be used by the memory controller 22.

Figure 3:
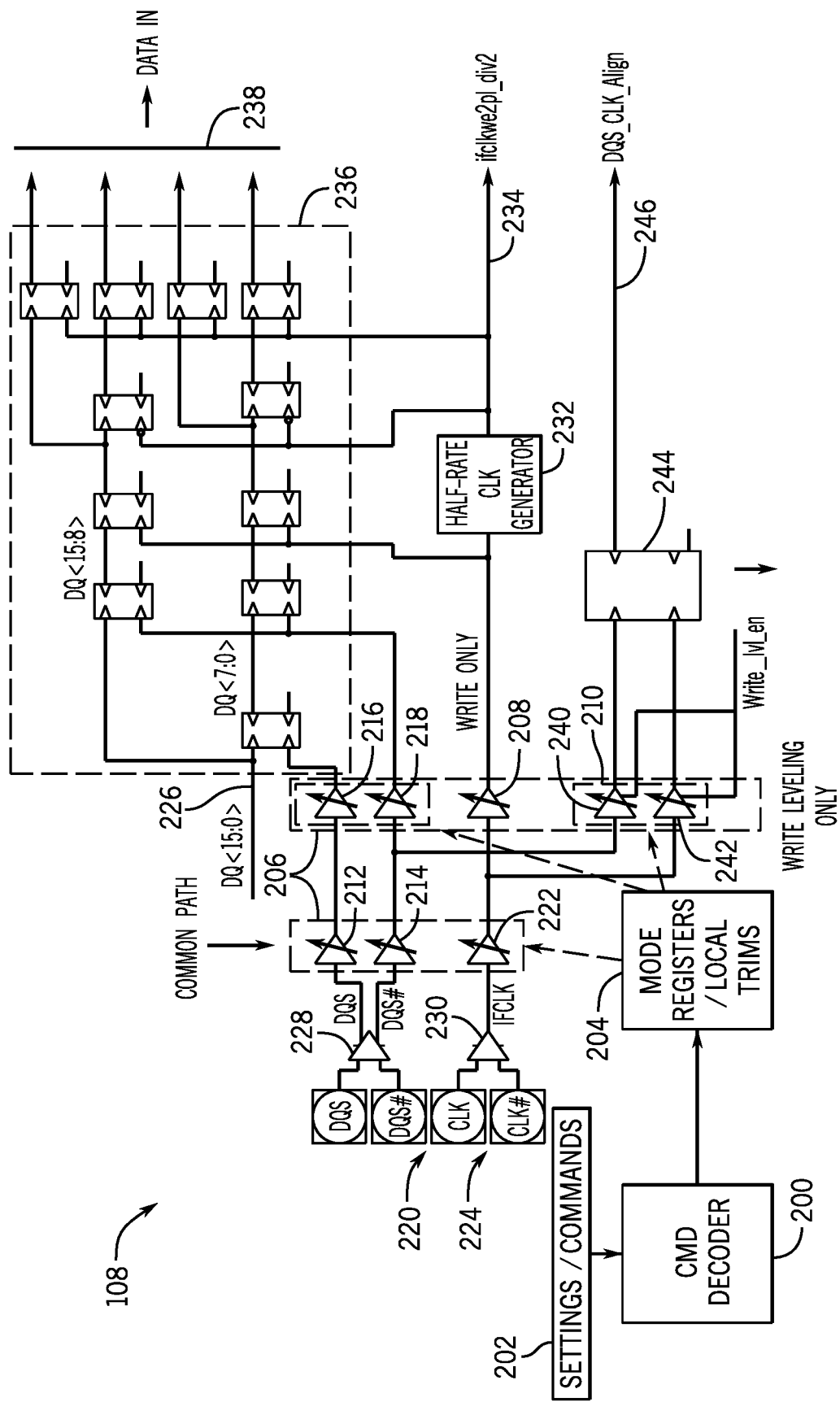
FIG. 3 is a circuit diagram depicting an adaptive write timing circuit, in accordance with an embodiment.

Turning now to FIG. 3, a block diagram of an embodiment of the adaptive write timing circuit 108 and a command (CMD) decoder 200 is illustrated. In the depicted embodiment, the CMD decoder 200 may receive certain write settings and/or commands 202. For example, write settings may include the write training settings 110, 112, 114, stored in the devices 102, 104, 106. The write commands may include tDQSS adjust commands, tDQSS set commands, and tDQSS commands. As mentioned earlier, the tDQSS adjust commands may provide a custom offset from the tDQSS (e.g., a time t offset from tDQSS), different, for example, from a factory or default offset for one or more of the devices 102, 104, 106. The set tDQSS commands may then tell the command decoder 200 to use the custom tDQSS offset for devices 102, 104, and/or 106. The reset tDQSS command may be used to tell the command decoder to reset to the factory or default tDQSS offset, if any.

In the depicted embodiment, the command decoder 200 may be operatively coupled to register/trims 204. Accordingly, the command decoder 200 may adjust write timings for a common path set of registers/trims 206, a normal write register/trim 208, and/or a write leveling registers/trims 210. The common path register/trims 206, for example, may include registers and/or trims (e.g., manufactured trimmed delays) 212, 214, 216, 218 suitable for adjusting data strobe (DQS) 220 timings, and registers and/or trims 222 suitable for adjusting CLK 224 timings for a data path 226. For example, the data path 222 may receive data to be written from the data pins 26, and the command decoder 200 may then, based on the received adjust, set, and rest commands, adjust the common path register/trims 206, the normal write register 208, and/or the write leveling register/trims 210 to carry out or otherwise execute the commands.

For reset commands, the command decoder 200 may load a factory or default tDQSS offset and adjust (e.g., write into register/trims of circuit 206, 208, and/or 210) to use the factory or default tDQSS. For adjust commands, the command decoder 200 may store custom tDQSS offsets derived, for example, individually for each device 102, 104, 106. For set commands, the command decoder 200 may use the stored custom tDQSS offsets when writing data into the devices 102, 104, 106.

For example, DQS 220 and CLK 224 signals may be processed via operational amplifiers (e.g., op amps) 228, 230 respectively and the resulting signals then adjusted via the common path circuit 206. Normal writes may then be further processed, for example, via register/trim 208 and a half-rate clock generator 232 to arrive at a normal write CLK signal 234 and to direct a flip flop circuit 236, for example, to provide for data in signals 238 to be written into the devices

102, 104, 106. Write leveling may be processed via register/trims 240, 242 and a flip flop 244 to derive a CLK signal 246 that is now more aligned with DQS. Accordingly, more efficient and improved data writes may be achieved without the use of write profile switching.

It is to be further noted that the adaptive techniques described herein may also be implemented in other circuit implementations and/or other memory types, including NAND, RAM, and the like. Indeed, by storing certain settings (e.g., timing offsets) in the devices themselves in lieu of or additional to storing device timing profiles in the memory controller (e.g., controller 22), the settings may be applied to write timings of multiple memory devices connected via a common data bus. In this manner, a more efficient write of data may be provided.

Figure 4:
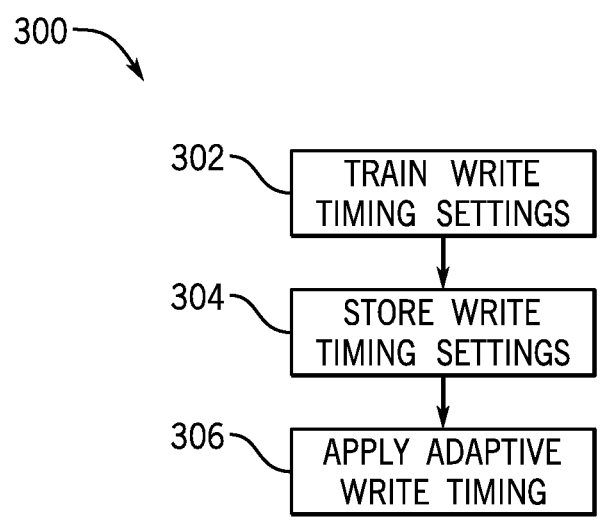
FIG. 4 is a flow chart of a process suitable for adaptively adjusting a write timing in one or more memory devices, in accordance with an embodiment.

FIG. 4 is flowchart illustrating an embodiment of a process 300 suitable for improving write timing in memory devices such as the memory systems 10, 100. The process 300 may be implemented as circuit (e.g., adaptive write circuit 108), computer code, or combination thereof, executable by the memory controller 22. In the depicted embodiment, the process 300 may first train (block 302) certain write timing settings, such as the tDQSS offset. That is the memory controller 22 may iteratively offset tDQSS to derive where the device's CLK (e.g., CLK received by devices 102, 104, 106) and tDQSS are more (or completely) internally aligned (e.g., are received by the device at approximately the same time and/or within a time range). The training (block 302) may occur in situ, for example, when the memory system 100 is first used, or when a user actives a training mode. The training (block 302) may include using the adaptive circuit 108 and/or memory controller 22 to adjust the tDQSS offset(s) to adaptively improve write timings of data transmitted via the common bus 24. Training (block 302) may also include enabling the command decoder 200 to receive certain write timing signals (e.g., write command signals and/or write timing settings) to set, adjust, and reset write timings.

The trained settings may then be stored (block 304), for example as the settings 110, 112, 114, in respective 3DXP devices 102, 104, 106. Training (block 302) may also include deriving the optional write profile 136 and saving (block 304) the profile 136 in the memory controller 22. However, the memory controller 22 may now store and apply a single common profile 136 as opposed to individual profiles. In use, the stored settings (e.g., settings 110, 112, 114, profile 136) may then be applied (block 306) during write operations, for example, to store data that has improved write timing even when multiple 3DXP devices 102, 104, 106 are connected to and are using the common bus 24.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory system, comprising:
a memory controller;
a data bus electrically coupled to the memory controller;
one or more memory devices communicatively coupled to the memory controller via the data bus, wherein each of the one or more memory devices stores a write training setting configured to adjust a write timing of data being sent by the memory controller to the one or more memory devices during write operations of the memory system; and
local trim circuitry manufactured to account for a local write timing of data sent by the memory controller to the one or more memory devices during the write operations of the memory system.

2. The memory system of claim 1, wherein the write training setting comprises an offset for a position (tDQSS) of a data strobe (DQS) signal relative to an internal clock signal (CLK).

3. The memory system of claim 2, wherein the tDQSS relative to CLK comprises a DQS start edge within a time range from a CLK start edge.

4. The memory system of claim 1, wherein the memory controller is operatively coupled to an adaptive write circuit configured to adjust the write timing, and wherein the adaptive circuit comprises a command decoder configured to receive one or more commands to adjust the write timing.

5. The memory system of claim 4, wherein the adaptive write circuit comprises a common path circuit configured to receive a data strobe (DQS) signal and a CLK signal and to adjust the DQS signal based on the write training setting.

6. The memory system of claim 5, wherein the adaptive write circuit comprises write leveling registers/trims electrically coupled to the common path circuit and configured to provide a DQS CLK align signal to adjust the write timing of the data.

7. The memory system of claim 5, the adaptive write circuit comprises a normal write circuit electrically coupled to the common path circuit and configured to provide an adjusted clock CLK signal to adjust the write timing of the data.

8. The memory system of claim 1, wherein the memory controller is configured to set the write timing of data to a default write training setting based on a reset command, to adjust the write timing of data to a custom write training setting based on a adjust command, and to set the custom write training setting during operations of the one or more memory devices based on a set command.

9. The memory system of claim 1, wherein the one or more memory devices comprises a three dimensional crosspoint memory (3DXP) device, a random access memory (RAM) device, a Not-AND (NAND) memory device, a flash memory device, or a combination thereof.

10. A method for adjusting a write timing in a memory system, comprising:
training a write training setting configured to adjust a write timing of data being sent from a memory controller included in the memory system to a memory device included in the memory system, wherein the memory system includes local trim circuitry manufactured to account for a local write timing of data sent by the memory controller to the memory device during the write operations of the memory system;
storing the write training setting in the memory device;
transmitting the write training setting from the memory device to the memory controller during operations of the memory system; and
applying the write training setting to adjust a write timing of data being sent by the memory controller to the one or more memory devices during write operations.

11. The method of claim 10, wherein the training occurs in situ when the memory system is first used, when a user of the memory system requests the training, or a combination thereof.

12. The method of claim 10, wherein the write training setting comprises an offset for a position (tDQSS) of a data strobe (DQS) signal relative to an internal clock signal (CLK).

13. The method of claim 10, wherein applying the write training setting comprises receiving a set command at a command decoder and using the write training setting instead of a default write setting.

14. The method of claim 10, wherein using the write training setting comprises adjusting a common path circuit configured to receive a data strobe (DQS) signal and a CLK signal and configured to adjust the DQS signal based on the write training setting.

15. The method of claim 11, wherein adjusting the common path circuit comprises adjusting a write leveling circuit electrically coupled to the common path circuit and configured to provide a DQS CLK align signal to adjust the write timing of the data.

16. A memory device, comprising:
   a memory array having at least one memory cell; and
   an adaptive write timing circuit configured to apply a write timing setting stored in the memory device to adjust a write timing of data being sent from a memory controller to the memory device during write operations of the memory array, wherein the memory device is communicatively coupled to the memory controller via a data bus shared with a plurality of memory devices, and wherein the adaptive timing circuit comprises local trim circuitry manufactured to account for a local write timing of data sent by the memory controller to the memory device during the write operations of the memory system.

17. The memory device of claim 16, wherein the memory array is stored in a three dimensional crosspoint memory (3DXP) device, a random access memory (RAM) device, a Not-AND (NAND) memory device, a flash memory device, or a combination thereof.

18. The memory device of claim 16, wherein the write training setting comprises an offset for a position (tDQSS) of a data strobe (DQS) signal relative to an internal clock signal (CLK).

19. The memory device of claim 16, comprising a command decoder operatively coupled to a common path circuit, wherein the command decoder is configured to receive a command to adjust a data strobe (DQS) signal via the common path circuit.

20. The memory device of claim 19, wherein the command decoder is operatively coupled to a write leveling circuit electrically coupled to the common path circuit and configured to provide a DQS CLK align signal to adjust the write timing of the data and wherein the command decoder is operatively coupled to a normal write circuit electrically coupled to the common path circuit and configured to provide an adjusted clock CLK signal to adjust the write timing of the data.

* * * * *